United States Patent
Nishimura

(10) Patent No.: US 9,997,742 B2
(45) Date of Patent: Jun. 12, 2018

(54) METHOD OF MANUFACTURING AN ORGANIC EL DISPLAY DEVICE

(71) Applicant: Japan Display Inc., Minato-ku (JP)

(72) Inventor: Masumi Nishimura, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days. days.

(21) Appl. No.: 15/425,297

(22) Filed: Feb. 6, 2017

(65) Prior Publication Data
US 2017/0279085 A1    Sep. 28, 2017

(30) Foreign Application Priority Data
Mar. 25, 2016    (JP) ................................ 2016-061293

(51) Int. Cl.
| H01L 33/00 | (2010.01) |
| H01L 51/56 | (2006.01) |
| H01L 27/32 | (2006.01) |
| H01L 51/00 | (2006.01) |
| H01L 51/52 | (2006.01) |

(52) U.S. Cl.
CPC .......... *H01L 51/56* (2013.01); *H01L 27/3251* (2013.01); *H01L 51/003* (2013.01); *H01L 51/5246* (2013.01); *H01L 2227/323* (2013.01); *H01L 2227/326* (2013.01)

(58) Field of Classification Search
CPC ... H01L 27/3251; H01L 51/003; H01L 51/56; H01L 51/5246; H01L 2227/326; H01L 2227/323
See application file for complete search history.

(56) References Cited

U.S. PATENT DOCUMENTS

| 7,990,605 B2* | 8/2011 | Okuyama ........... B29C 35/0894 345/107 |
| 8,493,526 B2* | 7/2013 | Uchida .................. G02B 6/005 349/64 |
| 9,052,520 B2* | 6/2015 | Shinkai ..................... F21V 7/00 |
| 9,395,573 B2* | 7/2016 | Ebisui .................. G02F 1/1334 |
| 2005/0110020 A1* | 5/2005 | Hayashi .................. H01L 27/12 257/72 |
| 2014/0042408 A1* | 2/2014 | Akagawa ............ H01L 51/5253 257/40 |

FOREIGN PATENT DOCUMENTS

JP    2009-205941    9/2009

* cited by examiner

*Primary Examiner* — Savitr Mulpuri
(74) *Attorney, Agent, or Firm* — Oblon, McClelland, Maier & Neustadt, L.L.P.

(57) ABSTRACT

A method of manufacturing an organic EL display device includes disposing a second base material that is disposed to face a first base material having a display region and including a TFT layer on a supporting substrate that supports the second base material, disposing the first base material on a side opposite to a side where the supporting substrate of the second base material is disposed, disposing a dam material that surrounds the display region between the first base material and the second base material, filling an inside of the dam material with a filling material between the first base material and the second base material, disposing an auxiliary wall to be separated from an outside of the dam material between the first base material and the second base material, and cutting the second base material through the supporting substrate between the dam material and the auxiliary wall.

3 Claims, 7 Drawing Sheets

METHOD OF MANUFACTURING AN ORGANIC EL DISPLAY DEVICE

CROSS-REFERENCE TO RELATED APPLICATION

The present application claims priority from the Japanese Application JP2016-061293 filed on Mar. 25, 2016, the content of which is hereby incorporated by reference into this application.

BACKGROUND OF THE INVENTION

1. Field of the Invention

One or more embodiments of the present invention relate to a method of manufacturing an organic EL display device.

2. Description of the Related Art

For example, in a display using a flexible substrate disclosed in JP 2009-205941 A, a method of supporting a base material by a glass substrate is adopted, in order to secure shape stability of the base material when manufactured.

SUMMARY OF THE INVENTION

For example, after a counter base material that is formed on a glass substrate is bonded to a base material having a display region and including a TFT layer, the glass substrate is removed from the counter base material. Thereafter, the counter base material may be partially cut and removed in order to pull out a terminal (connection portion to an external terminal) of a display. In this case, if the counter base material is partially cut and removed after the counter base material and the glass substrate are separated from each other, a foreign material may be attached to the display region at the time of cutting and removing, and lowering may be caused in quality of the obtained display.

One or more embodiments of the present invention realize a method of manufacturing an organic EL display device that is excellent in quality, in consideration of the above problems.

According to one aspect of the present invention, a method of manufacturing an organic EL display device is provided. The method includes disposing a second base material that is disposed to face a first base material having a display region and including a TFT layer on a supporting substrate that supports the second base material, disposing the first base material on a side opposite to a side where the supporting substrate of the second base material is disposed, disposing a dam material that surrounds the display region between the first base material and the second base material, filling an inside of the dam material with a filling material between the first base material and the second base material, disposing an auxiliary wall to be separated from an outside of the dam material between the first base material and the second base material, and cutting the second base material through the supporting substrate between the dam material and the auxiliary wall.

In one embodiment of the present invention, the method further includes forming a protrusion portion in a region of the first base material where the auxiliary wall is disposed, the protrusion portion protruding toward the side where the second base material is disposed.

In one embodiment of the present invention, the method further includes making a peeling agent be present in a space between the protrusion portions which are adjacent to each other.

In one embodiment of the present invention, the method further includes forming a peeling layer in the region of the first base material where the auxiliary wall is disposed.

In one embodiment of the present invention, the peeling layer includes an organic EL layer.

DETAILED DESCRIPTION OF THE INVENTION

Figure 1:
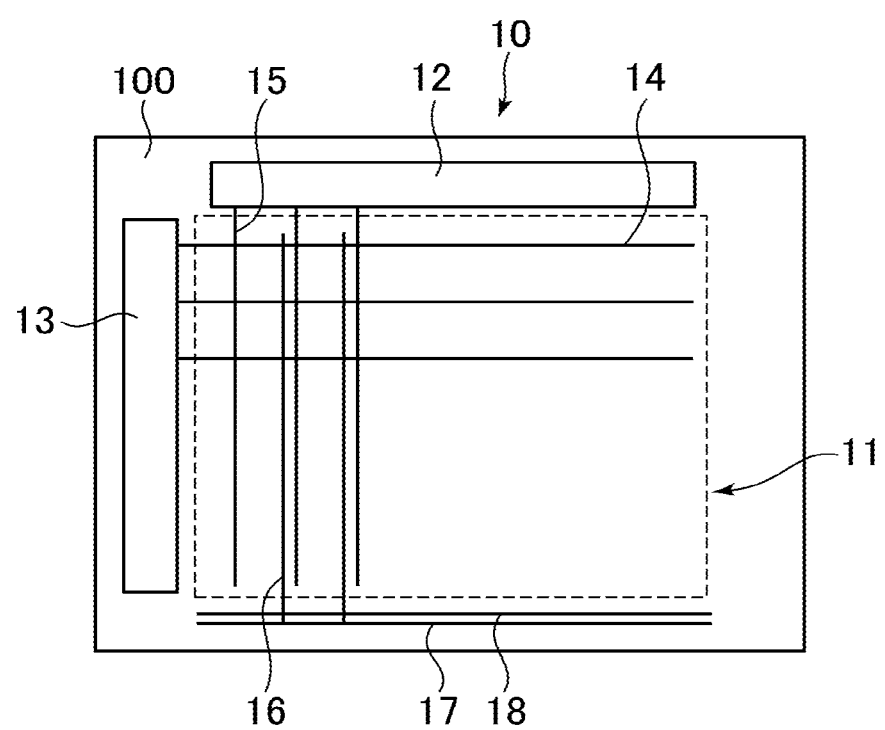
FIG. 1 is a diagram for describing an outline of a circuit configuration of an organic EL display device.

Hereinafter, embodiments of the present invention will be described with reference to the drawings. Since the disclosure is merely an example and persons skilled in the art may easily conceive modifications which are appropriately modified with retaining the gist of the invention, needless to say, the modifications are included in the scope of the present invention. Moreover, in order to clarify the description more clearly, the drawings may be schematically evaluated in widths, thicknesses or shapes of respective portions in comparison with actual dimensions, but the drawings are merely examples, and do not limit the explanation of the present invention. In the present specification and the respective drawings, the detailed description may be appropriately omitted, by assigning the same reference signs to the same elements described before in the drawings which are previously illustrated.

Figure 2:
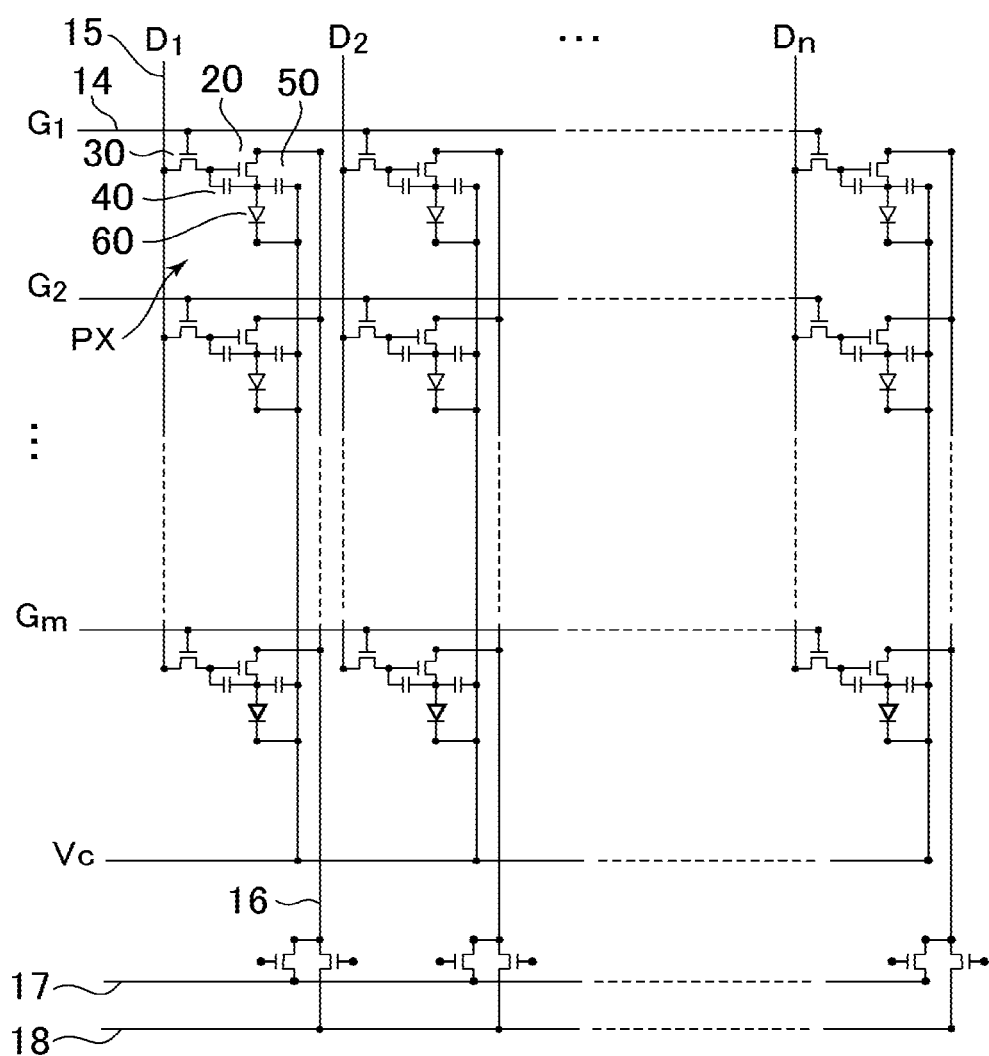
FIG. 2 is a diagram illustrating an example of a circuit diagram of the organic EL display device.

FIG. 1 is an outline diagram for describing a circuit configuration of an organic EL display device, and FIG. 2 illustrates an example of a circuit diagram of the organic EL display device.

An organic EL display device 10 displays an image by controlling respective pixels which are formed in a display region 11 on a substrate 100, by a data drive circuit 12 and a scan drive circuit 13. Here, for example, the data drive circuit 12 is an integrated circuit (IC) that generates and sends a data signal to be sent to each pixel, and the scan drive circuit 13 is an IC that generates and sends a gate signal to a thin film transistor (TFT) included in the pixel. In FIG. 1, a case where the data drive circuit 12 and the scan drive circuit 13 are formed in two places is illustrated, but the data drive circuit 12 and the scan drive circuit 13 may be incorporated into one IC, or may be formed by a circuit which is directly wired on the substrate 100.

As illustrated in FIG. 2, a scan line 14 transmits a signal from the scan drive circuit 13, and is connected to a gate electrode of a switch transistor 30. Moreover, a data line 15 transmits a signal from the data drive circuit 12, and is connected to source and drain electrodes of the switch transistor 30. A reference potential for causing an organic light-emitting diode 60 to emit the light is applied to a potential wiring 16, and the potential wiring 16 is connected to the source and drain electrodes of a driver transistor 20. A first potential supply wiring 17 and a second potential supply wiring 18 are connected to a potential supply source, and are connected to the potential wiring 16 through a transistor. A configuration illustrated in FIG. 2 is an example, and the embodiments are not limited to the above description.

As illustrated in FIG. 2, in the display region 11 of the organic EL display device 10, n number of the data lines 15 are formed as from D1 to Dn, and m number of the scan lines 14 are formed as from G1 to Gm. A plurality of pixels PX are arranged in a matrix shape in an extension direction of the scan line 14 and an extension direction of the data line 15. For example, the pixel PX is formed in a portion surrounded by G1, G2, D1 and D2.

If a first scan line G1 is connected to the gate electrode of the switch transistor 30 and the signal is applied from the scan drive circuit 13, the switch transistor 30 is in an ON state. If the signal is applied to the first data line D1 from the data drive circuit 12, electrical charges are stored in a storage capacitor 40, and a voltage is applied to the gate electrode of the driver transistor 20, and thereby, the driver transistor 20 is in the ON state. Here, even if the switch transistor 30 is in an OFF state, the driver transistor 20 is in the ON state for a fixed period by the electrical charges stored in the storage capacitor 40. Since an anode of the organic light-emitting diode 60 is connected to the potential wiring 16 by being passed between the source and the drain of the driver transistor 20 and a cathode of the organic light-emitting diode 60 is fixed to a reference potential Vc, a current flows to the organic light-emitting diode 60 depending on a gate voltage of the driver transistor 20, and the organic light-emitting diode 60 emits the light. Moreover, an additional capacitor 50 is formed between the anode and the cathode of the organic light-emitting diode 60. The additional capacitor 50 exhibits an effect of stabilizing the voltage which is written in the storage capacitor 40, and contributes to a stable operation of the organic light-emitting diode 60. Specifically, the effect is exhibited by making an electro-static capacitance of the additional capacitor 50 be greater than an electrostatic capacitance of the storage capacitor 40.

First Embodiment

A method of manufacturing an organic EL display device according to a first embodiment of the present invention will be described, by using FIG. 3A to FIG. 3D.

Figure 3A:
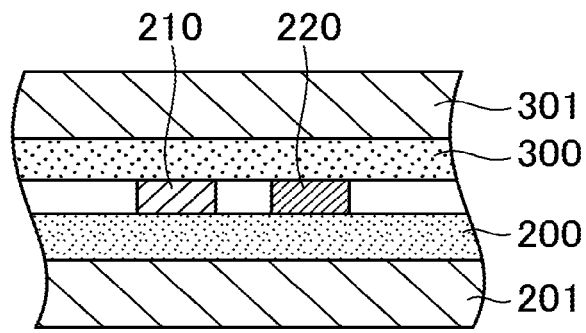
FIG. 3A, FIG. 3B, FIG. 3C and FIG. 3D are diagrams for describing a method of manufacturing an organic EL display device according to a first embodiment.

First, as illustrated in FIG. 3A, a first base material 200 has a display region and a terminal region, and includes a substrate which is formed of a polyimide resin, and is prepared on a glass substrate 201.

Figure 4A:
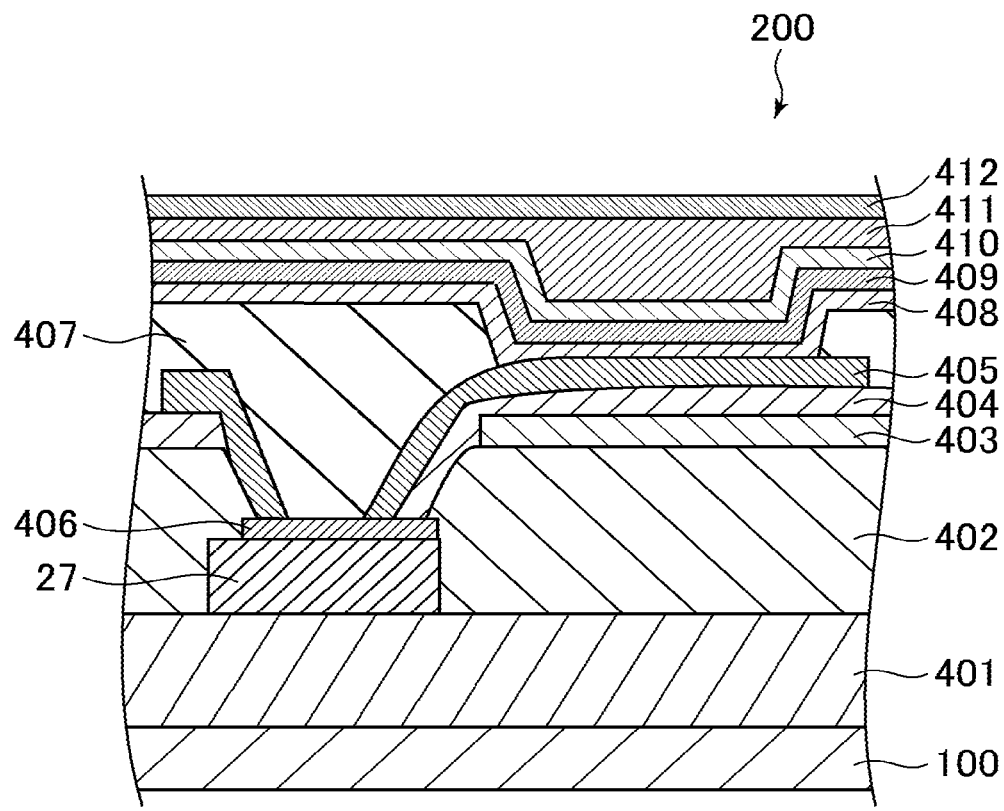
FIG. 4A is a diagram illustrating an example of a portion of a cross section of a display region in a first base material.
Figure 4B:
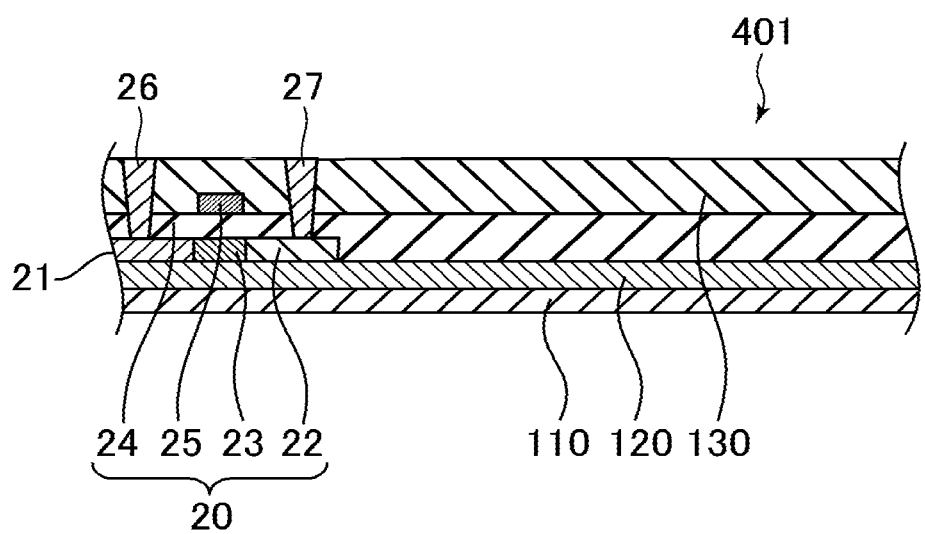
FIG. 4B is a diagram illustrating an outline of a cross section of a TFT layer which is included in the display region illustrated in FIG. 4A.

FIG. 4A is a diagram schematically illustrating an example of a portion of a cross section of the display region in the first base material 200, and FIG. 4B is a diagram schematically illustrating an outline of a cross section of a TFT layer 401 which is included in the display region.

As illustrated in FIG. 4A, the TFT layer 401 where the TFT for driving the pixel and the like are formed is disposed on the substrate 100. As illustrated in FIG. 4A and FIG. 4B, for example, a first base film 110 made of SiNx or the like, and a second base film 120 made of SiOx or the like are formed in this sequence, on the substrate 100. A drain electrode layer 21, a source electrode layer 22, and a channel layer 23 are formed on the second base film 120. After a gate insulating film 24 is formed so as to cover the drain electrode layer 21, the source electrode layer 22, the channel layer 23, and the second base film 120, a gate electrode layer 25 is formed above the channel layer 23. An interlayer insulating film 130 is formed so as to cover the gate electrode layer 25 and the gate insulating film 24, and through-holes respectively reaching the drain electrode layer 21 and the source electrode layer 22 are formed. In each of the through-hole, a drain electrode 26 and a source electrode 27 are formed.

As illustrated in FIG. 4A, a flat layer 402 is formed so as to cover the drain electrode 26, the source electrode 27, and the interlayer insulating film 130. On the flat layer 402, a metal layer 403, an insulating layer 404, and an anode electrode 405 are formed in this sequence. For example, the metal layer 403 has a stacked structure in which an Al layer is stacked on a Mo layer, and reflects the light from a light-emitting layer by a surface (Al layer) of the metal layer 403. The metal layer 403 may have other configurations as long as a predetermined reflectance or more may be secured on the surface thereof. As another structure, for example, a stacked structure in which an ITO layer, a Mo layer, and an Al layer are stacked in this sequence from a lower side of FIG. 4A may be used.

The metal layer 403 is electrically connected to a cathode electrode 409 described later, and thereby, the metal layer 403 is used as an auxiliary wiring of a power source wiring of the cathode electrode 409. Moreover, a capacitor layer (additional capacitor 50) is formed by interposing the insulating layer 404 between the metal layer 403 and the anode electrode 405. For example, the electrical connection of the metal layer 403 to the cathode electrode 409 is performed by disposing the through-hole on an outside of the display region. The insulating layer 404 is formed of, for example, SiNx. The anode electrode 405 may be formed of any suitable material. For example, an Al-based material, or a transparent conductive material such as indium tin oxide (ITO) or indium zinc oxide (IZO) is used.

As illustrated in FIG. 4A, the through-hole is formed on the source electrode 27 in the flat layer 402. An ITO layer 406 is formed in a bottom portion of the through-hole, and the insulating layer 404 and the anode electrode 405 are stacked on a side surface of a light-emitting region side of the through-hole. Moreover, the anode electrode 405 is stacked on the side surface of a counter side of the through-hole.

In the above structure, an RIB layer 407 that separates the pixels from each other is formed, and an organic EL layer 408 is formed on the RIB layer 407 and the anode electrode 405. Here, a region where the anode electrode 405 is in contact with the organic EL layer 408 becomes a light-emitting region, and the RIB layer 407 defines an outer edge of the light-emitting region.

On the organic EL layer 408, the cathode electrode 409 is formed. The cathode electrode 409 is formed of, for example, a transparent conductive material such as ITO or IZO. The cathode electrode 409 may be formed throughout a few pixels PX or all of the pixels PX which are arranged in the matrix shape. The organic EL layer 408 is formed by, for example, example, stacking a hole transport layer, a light-emitting layer, and an electron transport layer in sequence from the anode electrode 405 side. However, since the configuration is well known, the detailed description thereof will be omitted.

A first sealing film 410 is disposed on the cathode electrode 409, and a second sealing film 412 is disposed above the first sealing film 410 through an intermediate layer 411 which is configured of a resin material or the like.

As illustrated in FIG. 3A, a dam material 210 and an auxiliary wall 220 are formed in a second base material 300 in advance, and the second base material 300 is disposed on a first base material 200. At that time, the second base material 300 is supported by a glass substrate 301. The second base material 300 is configured by, for example, the substrate which is formed of the polyimide resin, and includes other members (for example, a color filter) as necessary.

The dam material 210 surrounds the display region, and is formed in a line shape so as to have a predetermined width and a predetermined height. The auxiliary wall 220 is formed in a line shape along the dam material 210 at a predetermined interval on a terminal region side (right side in the example illustrated in the drawing) of the dam material 210. For example, the auxiliary wall may be formed so as to surround not only the terminal region side of the dam material but also the dam material. As a formation material of the dam material and the auxiliary wall, an energy ray curable type resin composition is representatively used. For example, it is preferable that the dam material 210 and the auxiliary wall 220 be formed to have a height of several μm to several tens μm, and upper surfaces of the dam material 210 and the auxiliary wall 220 be formed so as to be substantially flush with each other.

Figure 3B:
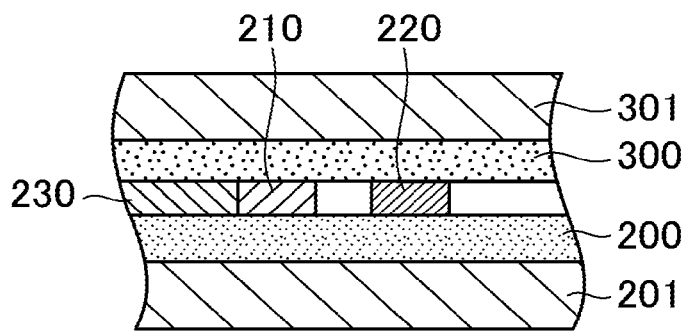

Next, as illustrated in FIG. 3B, an inside of the dam material 210 is filled with a filling material 230. Therefore, the filling material 230 may function as an adhesion layer between the first base material 200 and the second base material 300.

Figure 3C:
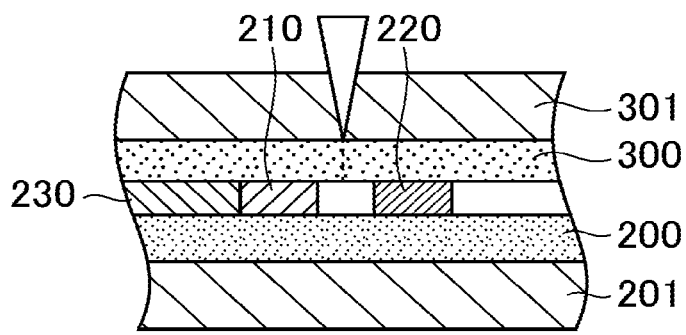

Next, as illustrated in FIG. 3C, the second base material 300 is cut by, for example, being irradiated with a laser beam (for example, by using excimer laser) through the glass substrate 301 between the dam material 210 and the auxiliary wall 220. In this manner, the second base material 300 is cut in a state where a surface of the second base material 300 is protected by the glass substrate 301 which is a supporting substrate, and thereby, a foreign material can be prevented from being attached to the display region at the time of cutting and removing, and quality of the obtained display can be favorably retained. Moreover, since the second base material 300 is supported by the auxiliary wall 220, cutting stability of the second base material 300 can be improved. For example, it is possible to favorably control an irradiation position of the laser beam, and it is possible to efficiently transmit the energy.

Figure 3D:
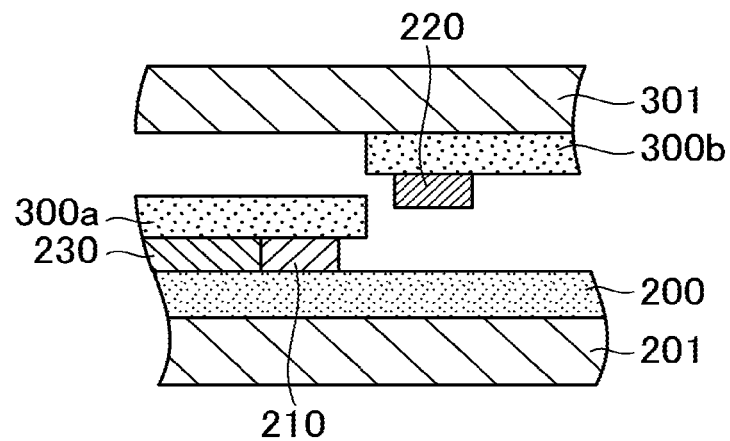
Figure 5:
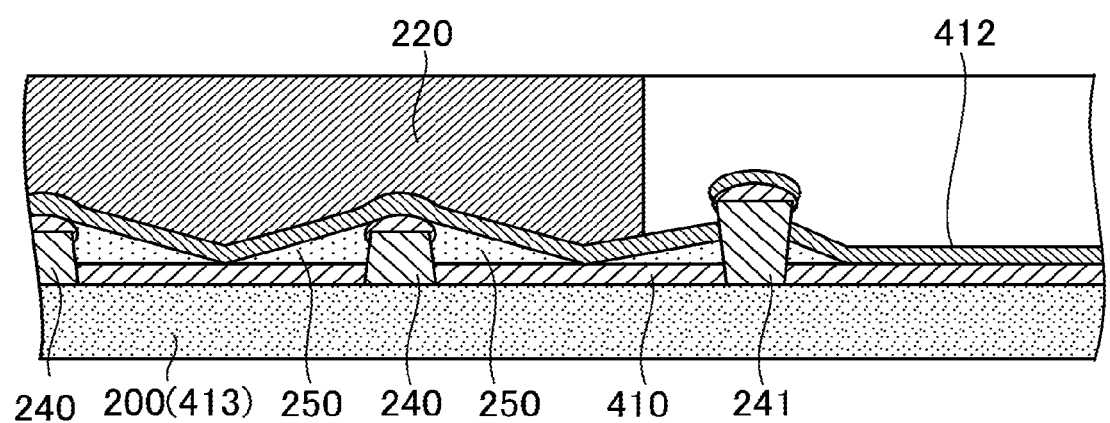
FIG. 5 is a diagram illustrating an example of a cross section of a region of the first base material where an auxiliary wall is disposed.

Thereafter, as illustrated in FIG. 3D, the glass substrate 301 is removed from a second base material 300a of the display region side. Preferably, after peeling ability of the glass substrate 301 with respect to the second base material 300a is improved by a process such as the laser beam irradiation, the glass substrate 301 is removed. Therefore, a second base material 300b of the terminal region side from the cut portion is accompanied with the glass substrate 301. At that time, it is preferable that the auxiliary wall 220 be also accompanied with the second base material 300b. For example, as illustrated in FIG. 5, a protrusion portion 240 protruding toward the side (upper side in the example illustrated in the drawing) on which the second base material 300 is disposed is formed in the first base material 200 in advance, and thereafter, the auxiliary wall 220 is disposed. For example, the protrusion portion 240 is formed in a lattice shape of a planar view at intervals of several μm in the region of the first base material 200 where the auxiliary wall 220 is formed. In this manner, a gap is formed by forming the protrusion portion, and thereby, the peeling ability of the auxiliary wall 220 is improved, and the auxiliary wall 220 can be accompanied with the second base material 300.

It is preferable that a peeling agent be present in a space 250 between the protrusion portions which are adjacent to each other. This is because the peeling ability of the auxiliary wall 220 may be further improved. The peeling agent is preferably configured of a resin composition (for example, resin composition including an acryl-based resin). In one embodiment, the formation material of the sealing layer is adopted as a peeling agent. In the example illustrated in the drawing, after the protrusion portion 240 is formed in a terminal wiring layer 413 which is formed on the substrate 100, the first sealing film 410 (for example, an inorganic film of SiNx or the like) is formed, and the peeling agent is present in a space between the protrusion portions which are adjacent to each other by any suitable method, and the second sealing film 412 (for example, an inorganic film of SiNx or the like) is formed, and the auxiliary wall 220 is disposed.

In the example illustrated in the drawing, a protrusion portion 241 is also formed on the outside of the auxiliary wall 220. The protrusion portion 241 has a shape of which a longitudinal section is a reversed trapezoid, and the height of the protrusion portion 241 is higher than that of the protrusion portion 240 which is formed under the auxiliary wall 220, and the sealing film is prevented from being peeled from the first base material 200 when the auxiliary wall 220 is removed. For example, the height of the protrusion portion 241 which is formed on the outside of the auxiliary wall 220 is set to be twice or more (specifically, 2 μm or more) of the sum of the thicknesses of the first sealing film 410 and the second sealing film 412.

Although not illustrated, after the supporting substrate is removed and the second base material is partially removed, an etching or the like is performed as necessary, and pulling out of the terminal to the first base material 200 is performed. Needless to say, a process of being divided into individual panels (individual pieces) is necessary at the any suitable timing.

Second Embodiment

A method of manufacturing an organic EL display device according to a second embodiment of the present invention will be described, by using FIG. 6A to FIG. 6D. In the following description, points that are the same as those of the first embodiment will be omitted.

Figure 6A:
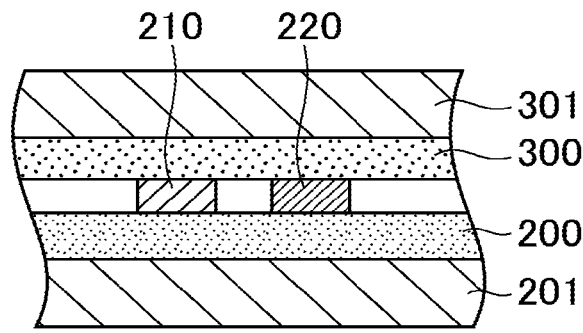
FIG. 6A, FIG. 6B, FIG. 6C and FIG. 6D are diagrams for describing a method of manufacturing an organic EL display device according to a second embodiment.
Figure 6B:
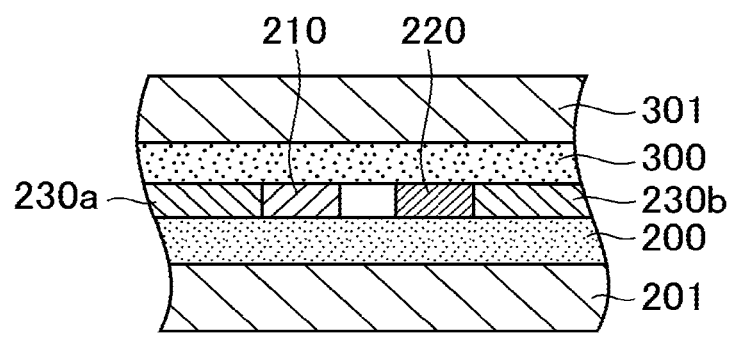
Figure 6C:
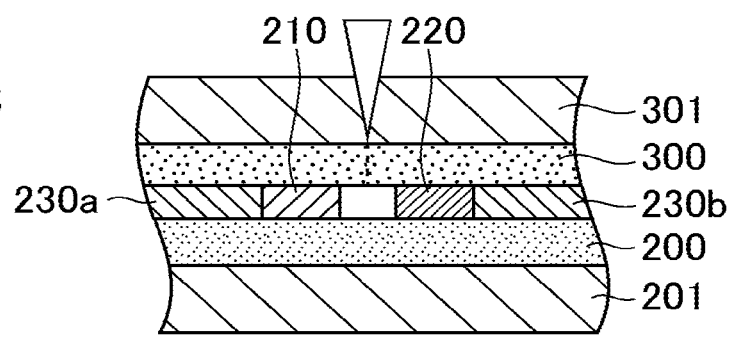

First, as illustrated in FIG. 6A, the second base material 300 where the dam material 210 and the auxiliary wall 220 are formed is disposed on the first base material 200, in the same manner as the first embodiment. Next, as illustrated in FIG. 6B, the inside of the dam material 210 and the terminal region side of the auxiliary wall 220 are respectively filled with filling materials 230a and 230b. Here, a formation range of the auxiliary wall may be widened instead of filling the terminal side region with the filling material. On the contrary, in a case where the filling material may be formed into a desired shape, the auxiliary wall may be formed of the filling material. Next, as illustrated in FIG. 6C, the second base material 300 is cut.

Figure 6D:
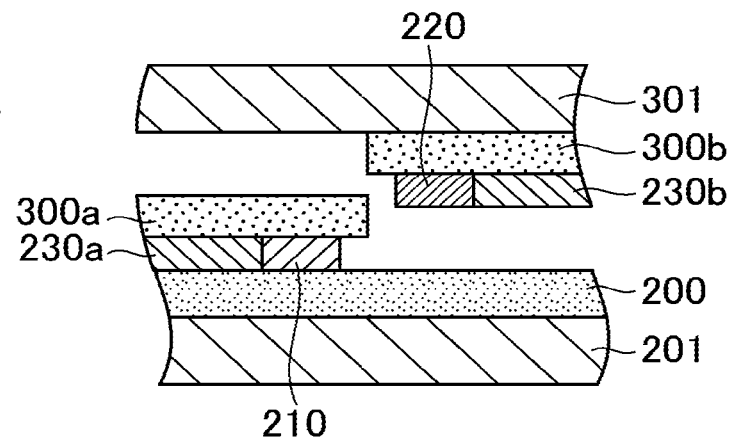
Figure 7:
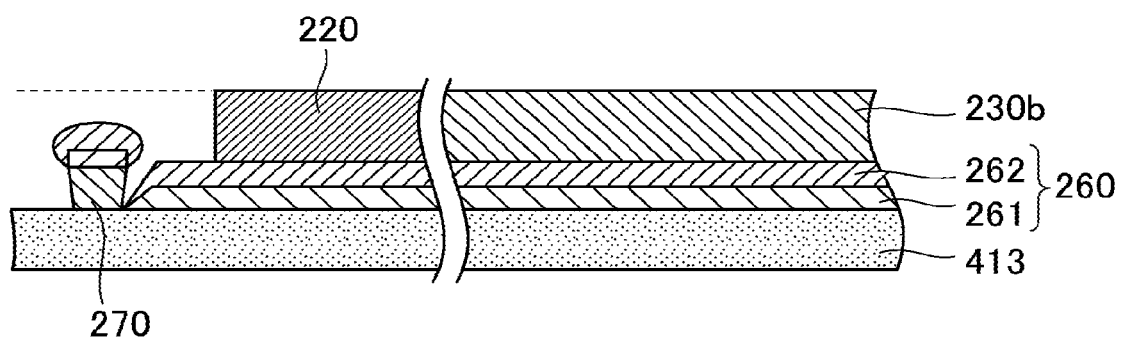
FIG. 7 is a diagram illustrating an example of the cross section of the region of the first base material where the auxiliary wall is disposed.

As illustrated in FIG. 7, in the embodiment, the auxiliary wall 220 and the filling material 230b are formed through a peeling layer 260 on the terminal wiring layer 413 which is formed on the substrate 100, and as illustrated in FIG. 6D, the second base material 300b of the terminal region side from the cut portion, the auxiliary wall 220, and the filling material 230b are accompanied with the glass substrate 301 when the glass substrate 301 is removed from the second base material 300a of the display region side. In the example illustrated in the drawing, the peeling layer 260 has a stacked structure in which an organic EL layer 261 and a sealing layer 262 are included in this sequence from the terminal wiring layer 413 side. Since the organic EL layer 261 has low adherence properties to the layer which is adjacent thereto, the organic EL layer 261 may be peeled from the terminal wiring layer 413 at the time of removing the glass substrate 301. Therefore, the removing of the supporting substrate and the pulling out of the terminal may be performed at the same time.

In the example illustrated in the drawing, a division wall 270 having the shape of which the longitudinal section is the reversed trapezoid is formed between the dam material 210 and the auxiliary wall 220, and for example, the peeling of the sealing layer and the organic EL layer of the display region side are prevented by dividing the organic EL layer 261 and the sealing layer 262.

The present invention is not limited to the above embodiments, and may be variously modified. For example, it is possible to replace the embodiments with a configuration that is substantially the same as the configurations described in the above embodiments, a configuration that achieves the same effects, or a configuration that can achieve the same purpose.

In the scope of the ideas of the present invention, the persons skilled in the art may conceive various types of modification examples and revision examples, and it is understood that the modification examples and the revision examples fall within the scope of the present invention. For example, embodiments in which the persons skilled in the art appropriately perform addition, deletion or design change of components to the embodiments described above, or perform addition, deletion or condition change of the processes thereto are included within the scope of the present invention as long as including the gist of the present invention.

What is claimed is:

1. A method of manufacturing an organic EL display device, the method comprising:
    disposing a second base material that is disposed to face a first base material having a display region and including a TFT layer on a supporting substrate that supports the second base material;
    disposing the first base material on a side opposite to a side where the supporting substrate of the second base material is disposed;
    disposing a dam material that surrounds the display region between the first base material and the second base material;
    filling an inside of the dam material with a filling material between the first base material and the second base material;
    disposing an auxiliary wall to be separated from an outside of the dam material between the first base material and the second base material;
    cutting the second base material through the supporting substrate between the dam material and the auxiliary wall; and
    forming a protrusion portion in a region of the first base material where the auxiliary wall is disposed, the protrusion portion protruding toward the side where the second base material is disposed.

2. The method of manufacturing an organic EL display according to claim 1, further comprising:
    making a peeling agent be present in a space between protrusion portions which are adjacent to each other.

3. A method of manufacturing an organic EL display device, the method comprising:
    disposing a second base material that is disposed to face a first base material having a display region and including a TFT layer on a supporting substrate that supports the second base material;
    disposing the first base material on a side opposite to a side where the supporting substrate of the second base material is disposed;
    disposing a dam material that surrounds the display region between the first base material and the second base material;
    filling an inside of the dam material with a filling material between the first base material and the second base material;
    disposing an auxiliary wall to be separated from an outside of the dam material between the first base material and the second base material;
    cutting the second base material through the supporting substrate between the dam material and the auxiliary wall; and
    forming a peeling layer in a region of the first base material where the auxiliary wall is disposed,
    wherein the peeling layer includes an organic EL layer.

* * * * *